(12) United States Patent
Tsuchiya et al.

(10) Patent No.: US 9,429,305 B2
(45) Date of Patent: Aug. 30, 2016

(54) LIGHT EMITTING DEVICE

(71) Applicant: TOYODA GOSEI CO., LTD., Kiyosu-shi (JP)

(72) Inventors: Yosuke Tsuchiya, Kiyosu (JP); Shota Shimonishi, Kiyosu (JP); Shigeo Takeda, Kiyosu (JP); Tomohiro Miwa, Kiyosu (JP)

(73) Assignee: TOYOTA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/555,411

(22) Filed: Nov. 26, 2014

(65) Prior Publication Data

US 2015/0146427 A1 May 28, 2015

(30) Foreign Application Priority Data

Nov. 27, 2013 (JP) .................. 2013-244922

(51) Int. Cl.
| | |
|---|---|
| *H01L 33/62* | (2010.01) |
| *H01L 25/13* | (2006.01) |
| *F21V 23/00* | (2015.01) |
| *H01L 25/075* | (2006.01) |
| *F21V 19/00* | (2006.01) |
| *H05B 33/08* | (2006.01) |
| *F21Y 105/00* | (2016.01) |

(52) U.S. Cl.
CPC ........... *F21V 23/001* (2013.01); *F21V 19/005* (2013.01); *H01L 25/075* (2013.01); *H01L 25/0753* (2013.01); *F21V 23/005* (2013.01); *F21Y 2105/003* (2013.01); *H05B 33/083* (2013.01); *H05B 33/0827* (2013.01)

(58) Field of Classification Search
CPC ............. H01L 25/0753; H01L 33/62; H05B 33/0827; H05B 33/083
See application file for complete search history.

(56) References Cited

U.S. PATENT DOCUMENTS

| | | | |
|---|---|---|---|
| 2005/0207165 A1 | 9/2005 | Shimizu et al. | |
| 2012/0319143 A1 | 12/2012 | Takei et al. | |
| 2013/0127329 A1* | 5/2013 | Komada | F21V 9/02 313/498 |
| 2013/0141891 A1 | 6/2013 | Funakubo | |
| 2013/0249407 A1 | 9/2013 | Kashiwagi et al. | |

FOREIGN PATENT DOCUMENTS

| | | | |
|---|---|---|---|
| JP | 2003-124528 A | | 4/2003 |
| JP | 2010287657 A | * | 12/2010 |
| JP | 2013-004739 A | | 1/2013 |
| JP | 2013-118292 A | | 6/2013 |
| JP | 2013-201355 A | | 10/2013 |

* cited by examiner

*Primary Examiner* — Mariceli Santiago
(74) *Attorney, Agent, or Firm* — McGinn IP Law Group PLLC

(57) ABSTRACT

A light emitting device includes a substrate that has a circular light emitting region thereon, and a plurality of light emitting elements that is mounted on the light emitting region. The light emitting elements are arranged in a matrix shape of multiple rows and multiple columns. At least one of the rows or the columns is arranged so as to follow an outer end of the circular light emitting region and to deviate from virtual straight lines of the rows or the columns.

10 Claims, 3 Drawing Sheets

LIGHT EMITTING DEVICE

CROSS-REFERENCE TO RELATED APPLICATIONS

This application claims the benefit of Japanese Patent Application No. 2013-244922 (filed on Nov. 27, 2013), the entire contents of which are incorporated by reference herein.

BACKGROUND

1. Technical Field

The present invention relates to a light emitting device in which a plurality of light emitting elements is mounted on a substrate. More particularly, the present invention relates to a light emitting device in which a plurality of light emitting elements mounted on a substrate is electrically connected to each other by thin metal wires.

2. Related Art

Conventionally, a light source such as an incandescent light bulb, a fluorescent lamp, and a high-pressure discharge lamp has been used as lighting equipment. However, recently, from the viewpoint of low power consumption and long lifetime, an illumination light source using an LED (Light Emitting Diode) element has been popular. An LED light source configured by one LED element has low emission intensity. Accordingly, a plurality of LED elements is used in order to obtain the emission intensity comparable to the conventional light source. In order to realize an LED illumination light source with high output, a mounting density of the LED elements onto a substrate tends to increase.

In such an LED illumination light source, various methods for arranging LED elements have been proposed (e.g., see Patent Documents 1 to 4). Among these methods, in order to achieve uniformity of the emitted light from the LED illumination light source, in many cases, an LED element mounting region is formed in a circular shape and the LED elements are regularly arranged. FIG. 1 illustrates an LED illumination light source in which LED elements are regularly arranged. In an LED illumination light source 10 shown in FIG. 1, a substrate 1 includes a bonding pad 1a for electrical connection with multiple LED elements 2, an external connection pad 1c for electrical connection with the outside of the LED illumination light source, and a wire 1b for connecting the bonding pad 1a and the external connection pad 1c. An annular dam portion 3 is formed on a surface of the substrate 1 and a plurality of LED elements 2 is regularly arranged in a matrix shape of twelve rows and seven columns at a region inside the annular dam portion 3. In this example, seventy two LED elements 2 are arranged. When an external voltage is applied to the external connection pad 1c, current flows through each LED element 2 so that each LED element emits light.

Recently, from the demand for a high-output LED illumination light source, an amount of heat generated from each LED element tends to increase. For the LED element, it is generally known that the emission intensity is lowered and thus reliability is degraded when the junction temperature becomes higher.

Patent Document 1: JP-A-2003-124528
Patent Document 2: JP-A-2013-004739
Patent Document 3: JP-A-2013-118292
Patent Document 4: JP-A-2013-201355

SUMMARY

In the LED illumination light source shown in FIG. 1, of the LED elements 2 arranged in a matrix shape of twelve rows and seven columns, the LED elements 2 located at the center portion of the matrix shape are surrounded by other LED elements 2. Accordingly, the LED elements 2 located at the center portion of the matrix shape are exposed to higher temperature than the LED elements 2 located at the peripheral portion thereof. Thereby, the junction temperature of the LED elements 2 located at the center portion of the matrix shape is higher than that of the LED elements 2 located at the peripheral portion thereof. By this effect, there is a problem that the entire emission intensity of the LED illumination light source is lowered and thus it is difficult to achieve sufficient reliability.

The present invention has been made in consideration of the problems in the prior art and an object thereof is to maintain the emission intensity of a light emitting device and thus to improve reliability thereof by lowering the maximum junction temperature of the light emitting element incorporated in a light emitting device.

In order to solve the above-described problems, the present invention provides a light emitting device having the following configurations.

(1) According to an aspect of the invention, a light emitting device includes:

a substrate that has a circular light emitting region thereon; and a plurality of light emitting elements that is mounted on the light emitting region, wherein the light emitting elements are arranged in a matrix shape of multiple rows and multiple columns, and wherein at least one of the rows or the columns is arranged so as to follow an outer end of the circular light emitting region and to deviate from virtual straight lines of the rows or the columns.

(2) In the light emitting device of (1), either the rows or the columns are arranged so as to deviate from the virtual straight lines.

(3) In the light emitting device of (2), a plurality of light emitting elements constituting the rows or the columns which deviate from the virtual straight lines is electrically connected by thin metal wires.

(4) In the light emitting device of (3), adjacent electrodes of the plurality of light emitting elements constituting the rows or the columns, which deviate from the virtual straight lines, are directly connected to each other by the thin metal wires obliquely and transversely in an inner direction of the light emitting elements.

(5) In the light emitting device of any one of (1) to (4), the light emitting region is surrounded by a dam portion for sealing the light emitting elements.

(5) In the light emitting device of (1), a shape of the outer end of the light emitting region is defined by a dam portion for sealing the light emitting elements.

(6) According to another aspect of the invention, a light emitting device includes:

a substrate that has a circular light emitting region thereon; and a plurality of light emitting elements that is mounted on the light emitting region, wherein the light emitting elements include a center row in which the light emitting elements are linearly arranged and the other rows in which the light emitting elements are non-linearly arranged, and wherein an outmost row of the other rows follow an outer end of the circular light emitting region.

According to the light emitting device of the present invention, a circular light emitting region is provided for achieving uniform light emission, light emitting elements are arranged in a matrix shape of multiple rows and multiple columns at a region inside the circular light emitting region, and at least one of the rows or the columns is arranged so as to follow the circular light emitting region and to deviate from virtual straight lines of the rows or the columns. Thereby, in the light emitting elements located at the center portion of the matrix shape, intervals between adjacent light emitting elements increase, as compared to the light emitting elements located at the peripheral portion thereof. Therefore, the heat dissipation of the center portion where the heat generated from the light emitting elements is liable to stay is enhanced. As a result, it is possible to achieve uniformity in the junction temperature of the light emitting elements. Thereby, it is possible to maintain the emission intensity of the light emitting device and thus to improve reliability thereof.

BRIEF DESCRIPTION OF THE DRAWINGS

FIG. 3A is a top view showing the entire light emitting region and FIG. 3B is an enlarged top view of adjacent two LED elements.

DETAILED DESCRIPTION

First Embodiment

Figure 2:
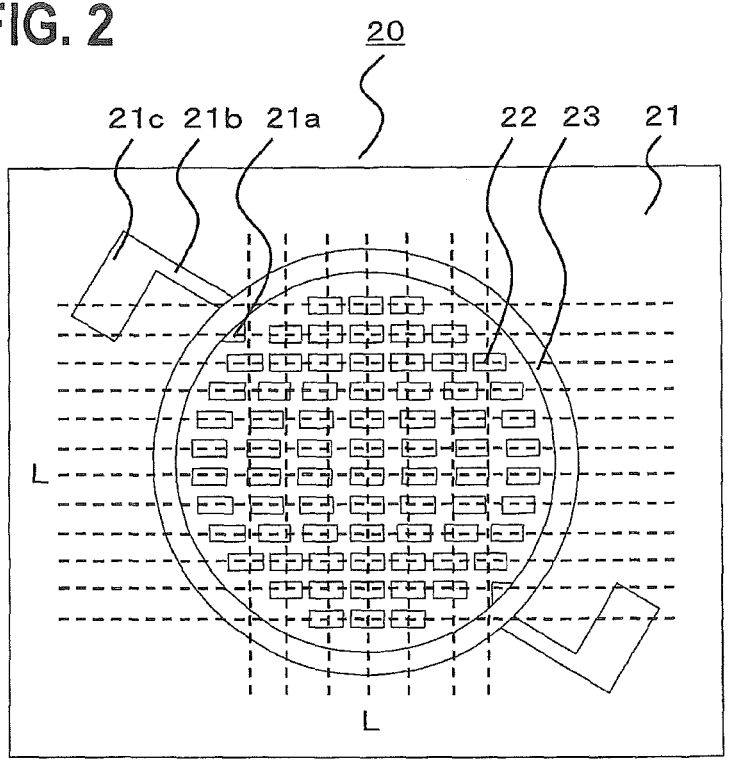
FIG. 2 is a top view showing an LED light emitting device according to a first embodiment of the present invention.

FIG. 2 is a top view of an LED light emitting device 20 according to a first embodiment of the present invention.

Here, dotted lines in FIG. 2 represent virtual straight lines L indicating a matrix.

In the LED light emitting device 20 according to the first embodiment of the present invention, a wiring substrate 21 includes a bonding pad 21a for electrical connection with multiple LED elements 22, an external connection pad 21c for electrical connection with the outside of an LED illumination light source, and a wire 21b for connecting the bonding pad 21a and the external connection pad 21c. An annular dam portion 23 is formed on a surface of the substrate 21 and a plurality of LED elements 22 is arranged in a matrix shape (indicated by virtual straight lines L) of twelve rows and seven columns at a region inside the annular dam portion 23. In this example, seventy two LED elements 22 are arranged. When an external voltage is applied to the external connection pad 21c, current flows through each LED element 22 so that each LED element emits light.

The wiring substrate 21 is made of, for example, alumina ($Al_2O_3$) or aluminum nitride (AlN). Further, the bonding pad 21a, the external connection pad 21c and the wire 21b are formed by plating nickel (Ni), gold (Au), silver (Ag) or the like on tungsten (W), for example.

In addition, the wiring substrate 21 is sufficient to have a wiring function as a whole. For example, the wiring substrate 21 may be a composite substrate where a glass epoxy substrate or a polyimide substrate or the like is bonded to a metallic plate such as an aluminum plate. In this case, the heat generated from the LED elements is directly heat-transferred through the aluminum plate when an LED element mounting portion is made of an aluminum plate and the substrate is placed around the LED element mounting portion. Accordingly, it is possible to achieve high heat dissipation in the LED light emitting device.

The LED element 22 is made of, for example, an inorganic compound semiconductor LED such as GaN-based LED, InP-based LED, or GaAs-based LED.

The dam portion 23 is made of thermosetting resin such as epoxy resin, silicone resin or fluororesin, for example.

Figure 1:
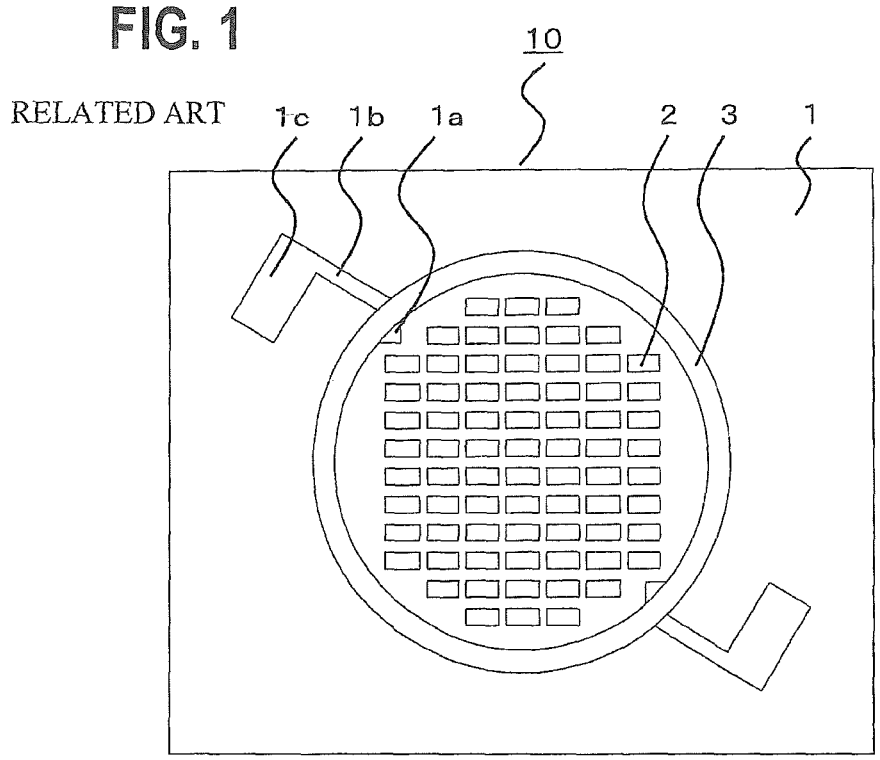
FIG. 1 is a top view showing an example of a conventional LED light emitting device.

Here, an inner side of the dam portion 23 is filled with the thermosetting resin such as epoxy resin, silicone resin or fluororesin so as to seal the LED elements 22 although being omitted in the LED light emitting device shown in FIG. 1 for the purpose of clarifying the arrangement of the LED elements 22. Appropriately, the sealing portions may contain phosphors such as YAG:Ce and a light diffusing material such as $SiO_2$.

The LED elements 22 are arranged to deviate from the virtual straight lines L in a column direction and to follow the annular dam portion 23 in such a way that a degree of deviation from the virtual straight lines L is sequentially increased toward the peripheral portion from the center portion.

According to the LED light emitting device of the illustrative embodiment of the present invention as described above, the LED elements 22 are arranged to deviate from the virtual straight lines L in the column direction in such a way that a degree of deviation from the virtual straight lines L is sequentially increased. Accordingly, intervals between adjacent LED elements 22 in the light emitting elements arranged at the circular light emitting region inside the dam portion 23 are further increased, as compared to the LED elements 22 located at the peripheral portion thereof. That is, the LED elements 22 have some degree of regularity in the arrangement thereof. However, the density of the LED elements 22 at the center portion of the light emitting region becomes lower than that of the LED elements 22 at the peripheral portion of the light emitting region by arranging the LED elements 22 in a state where the regularity is broken. Thereby, the heat dissipation of the center portion where the heat generated from the LED elements 22 is liable to stay is enhanced. As a result, it is possible to achieve uniformity in the junction temperature of the light emitting elements. In this way, it is possible to maintain the emission intensity of the LED light emitting device and thus to improve reliability thereof.

Figure 3A:
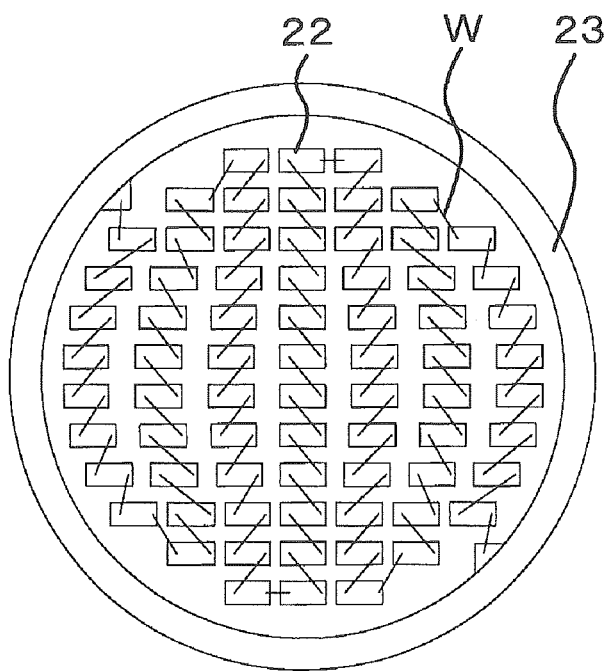
FIG. 3A and FIG. 3B are top views of a light emitting region showing an electrical connection state of the LED light emitting device according to the first embodiment of the present invention.
Figure 3B:
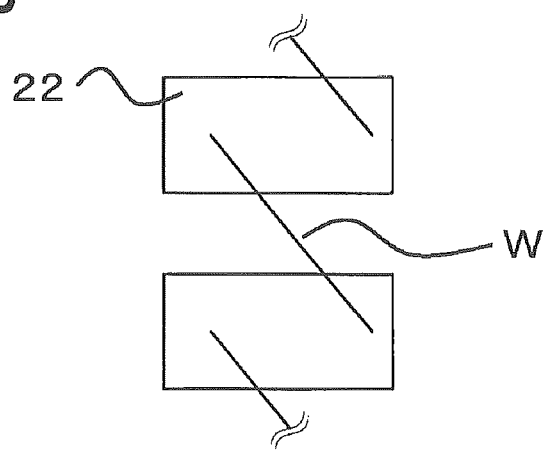

FIG. 3A and FIG. 3B are top views of a light emitting region showing an electrical connection state of the LED light emitting device according to the first embodiment of the present invention. FIG. 3A is a top view showing the entire light emitting region and FIG. 3B is an enlarged top view of adjacent LED elements.

Here, an example has been described in which the LED element 22 uses a single-sided electrode type LED element 22 which is provided at its one side with a positive and negative electrodes, and seventy two LED elements 22 arranged in a matrix shape are connected in series. That is, each of the LED elements 22 is electrically connected to the positive and negative bonding pads 21a which are disposed diagonally.

Each of the LED elements 22 are electrically connected to each other by directly connecting adjacent LED elements 22 by a wire W. The wire W is made of, for example, gold (Au) or silver (Ag).

As shown in FIG. 3B, in the adjacent LED elements 22, the electrodes of the LED elements 22 are obliquely connected to each other transversely in an inner direction of the LED elements 22. With the connection in this way, the overlapped portions of the wire W with an upper surface of the LED element 22 are increased, as seen in a top view. As described above, when the LED elements 22 are made of inorganic material and a sealing portion for sealing the periphery of the LED elements 22 is made of organic resin, the coefficient of thermal expansion of the inorganic material is lower than that of the organic material. Accordingly, when the overlapped portions of the wire with the upper surface of the LED element 22, which is less susceptible to thermal expansion due to heating, are increased, the wire W is less susceptible to the effects of the thermal expansion. As a result, it is possible to prevent the disconnection of the wire W due to the thermal expansion.

Second Embodiment

Figure 4:
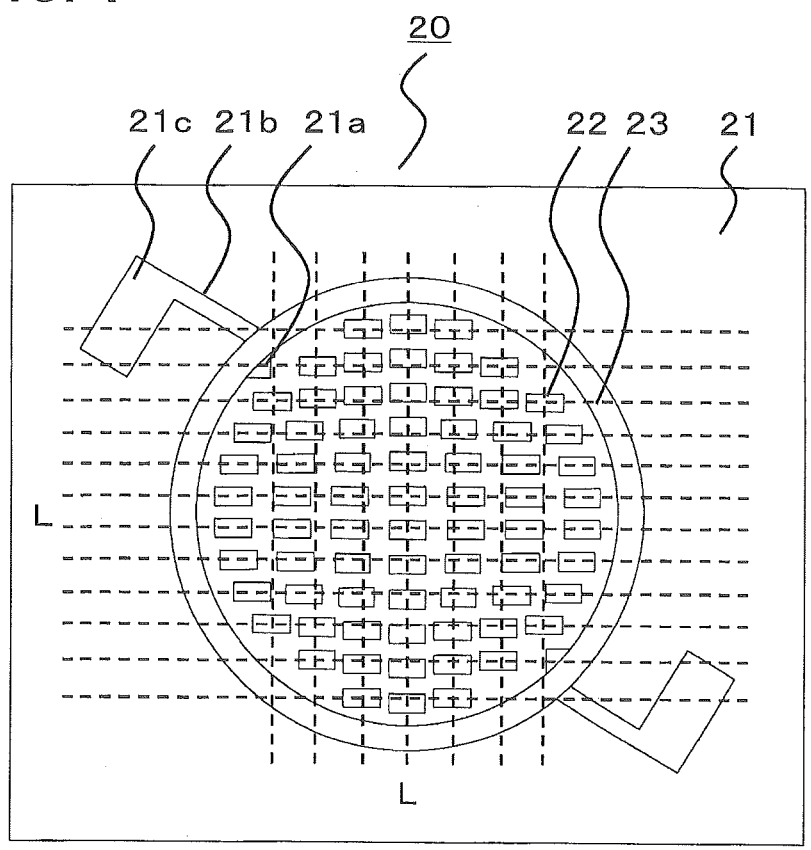
FIG. 4 is a top view showing an LED light emitting device according to a second embodiment of the present invention.

FIG. 4 is a top view of an LED light emitting device according to a second embodiment of the present invention.

The second embodiment is different from the first embodiment in that the LED elements 22 are arranged to deviate from the virtual straight lines L in a row direction as well as the virtual straight lines L in the column direction.

In the example shown in FIG. 4, seventy two LED elements 22 are arranged. When an external voltage is applied to the external connection pad 21c, current flows through each LED element 22 so that each LED element emits light. The LED elements 22 are arranged to deviate from the virtual straight lines L in the column direction and to follow the annular dam portion 23 in such a way that a degree of deviation from the virtual straight lines L is sequentially increased toward the peripheral portion from the center portion. Further, the LED elements 22 are arranged to deviate from the virtual straight lines L in the row direction and to follow the annular dam portion 23 in such a way that a degree of deviation from the virtual straight lines L is sequentially increased toward the peripheral portion from the center portion.

According to the LED light emitting device of the illustrative embodiment of the present invention as described above, the LED elements 22 are arranged to deviate from the virtual straight lines L in the row direction as well as in the column direction in such a way that a degree of deviation from the virtual straight lines L is sequentially increased. Accordingly, as compared with the first embodiment, intervals between adjacent LED elements 22 in the light emitting elements arranged at the circular light emitting region inside the dam portion 23 are further increased, as compared to the LED elements 22 located at the peripheral portion. Accordingly, the heat dissipation of the center portion where the heat generated from the LED elements 22 is liable to stay is enhanced.

The semiconductor light emitting device of the present invention can be employed in various light sources such as a planar illumination, a linear illumination, or a light bulb.

The present invention is not limited to the description of the above-described illustrative embodiments. The present invention also includes various modifications which can be easily conceived by those skilled in the art without departing from the description of the claims.

For example, in the above-described illustrative embodiment of the present invention, description has been made with reference to the LED elements. However, the present invention can be also applied to a light emitting device using other light emitting elements, for example, a semiconductor light emitting element such as a laser element, a light emitting thyristor element or the like. Further, although a wire has been described as an example of a material for connecting the LED elements to each other, other thin metal wires such as a ribbon may be used.

What is claimed is:
1. A light emitting device comprising:
a substrate that has a circular light emitting region thereon; and
a plurality of light emitting elements that is mounted on the light emitting region and arranged in multiple rows and multiple columns,
wherein the light emitting elements include a center row in which the light emitting elements are linearly arranged and the other rows in which the light emitting elements are non-linearly arranged,
wherein at least one of the rows or the columns is connected in series, and
wherein an outmost row of the other rows follow an outer end of the circular light emitting region.
2. The light emitting device according to claim 1, wherein the light emitting region is surrounded by a dam portion for sealing the light emitting elements.
3. The light emitting device according to claim 1, wherein a shape of the outer end of the light emitting region is defined by a dam portion for sealing the light emitting elements.
4. The light emitting device according to claim 1, wherein the substrate includes first and second bonding pads.
5. The light emitting device according to claim 1, wherein a light emitting element of the center row is nearer to an edge of the circular light emitting region than a light emitting element of the other rows.
6. The light emitting device according to claim 1, further comprising a plurality of metal wires connecting the plurality of light emitting elements to each other,
wherein each adjacent column is connected to each other only at one end of the adjacent columns via a wire of the plurality of wires.
7. The light emitting device according to claim 6, wherein the plurality of light emitting elements are electrically connected to the first and second bonding pads.
8. The light emitting device according to claim 6, wherein the substrate includes a first bonding pad and a second bonding pad,
wherein the first bonding pad is connected to a first light emitting element of the plurality of light emitting elements, each of the plurality of light emitting elements being electrically connected in series to the first light emitting element via the wire, and
wherein a last light emitting element of the plurality of light emitting elements connected in series is connected to the second bonding pad via the wire.
9. The light emitting device according to claim 6, wherein the substrate includes a bonding pad, and
wherein the bonding pad is connected to a first light emitting element of the plurality of light emitting elements, each of the plurality of light emitting ele- ments being electrically connected in series to the first light emitting element via the wire.

10. The light emitting device according to claim 6, wherein the substrate includes a first bonding pad and a second bonding pad,
   wherein the plurality of light emitting elements are electrically connected in series via the wires such that a first light emitting element is electrically connected to the first bonding pad and a last light emitting element in the series is electrically connected to the second bonding pad.

* * * * *